(12) United States Patent
Koyama

(10) Patent No.: US 9,137,933 B2
(45) Date of Patent: Sep. 15, 2015

(54) REFRIGERATION APPARATUS WITH A MAGNETICALLY SHIELDED REFRIGERANT PIPE

(75) Inventor: Yoshitsugu Koyama, Shiga (JP)

(73) Assignee: DAIKIN INDUSTRIES, LTD., Osaka (JP)

(*) Notice: Subject to any disclaimer, the term of this patent is extended or adjusted under 35 U.S.C. 154(b) by 484 days.

(21) Appl. No.: 12/994,157

(22) PCT Filed: May 14, 2009

(86) PCT No.: PCT/JP2009/002113
§ 371 (c)(1),
(2), (4) Date: Nov. 23, 2010

(87) PCT Pub. No.: WO2009/150785
PCT Pub. Date: Dec. 17, 2009

(65) Prior Publication Data
US 2011/0072833 A1    Mar. 31, 2011

(30) Foreign Application Priority Data

Jun. 13, 2008    (JP) .................................. 2008-155303

(51) Int. Cl.
| | | |
|---|---|---|
| F25D 23/12 | (2006.01) | |
| H05K 7/20 | (2006.01) | |
| F25B 31/00 | (2006.01) | |
| H01L 23/34 | (2006.01) | |
| H01L 23/427 | (2006.01) | |
| H01L 23/40 | (2006.01) | |
| H01F 17/06 | (2006.01) | |
| H01L 23/66 | (2006.01) | |

(52) U.S. Cl.
CPC .......... *H05K 7/20936* (2013.01); *F25B 31/006* (2013.01); *H01L 23/34* (2013.01); *H01L 23/427* (2013.01); *H01F 2017/065* (2013.01); *H01L 23/4006* (2013.01); *H01L 23/66* (2013.01); *H01L 2023/405* (2013.01); *H01L 2924/0002* (2013.01); *H01L 2924/3011* (2013.01)

(58) Field of Classification Search
CPC ...................... H01L 23/4006; H01L 2023/405
USPC .......................................... 62/259.2; 361/712
See application file for complete search history.

(56) References Cited

U.S. PATENT DOCUMENTS

| | | | | |
|---|---|---|---|---|
| 4,849,950 | A | * | 7/1989 | Sugiura et al. .................. 363/48 |
| 5,483,136 | A | * | 1/1996 | Marcinkiewicz ............. 318/558 |
| 5,980,306 | A | | 11/1999 | Tanaka et al. |

(Continued)

FOREIGN PATENT DOCUMENTS

| | | |
|---|---|---|
| JP | 62-69066 A | 3/1987 |
| JP | 10-135653 A | 5/1998 |

(Continued)

*Primary Examiner* — Frantz Jules
*Assistant Examiner* — Steve Tanenbaum
(74) *Attorney, Agent, or Firm* — Birch, Stewart, Kolasch & Birch, LLP

(57) ABSTRACT

A refrigeration apparatus includes: an electrical circuit (10) including a power device (14); a refrigerant jacket (30) which is thermally connected to the power device (14), and in which a refrigerant for a refrigeration cycle flows; a refrigerant pipe (20) which carries the refrigerant flowing in the refrigerant jacket (30), and forms a current path (20*a*, 20*b*) for grounding the refrigerant jacket (30); and a magnetic body (90) which is attached to the current path (20*a*, 20*b*), and generates a predetermined impedance in the current path (20*a*, 20*b*).

8 Claims, 6 Drawing Sheets

(56) References Cited

U.S. PATENT DOCUMENTS

| | | | |
|---|---|---|---|
| 6,501,172 B1* | 12/2002 | Fukada et al. | 257/707 |
| 6,639,144 B1* | 10/2003 | Toh | 174/350 |
| 2007/0133147 A1* | 6/2007 | Ritter et al. | 361/306.3 |
| 2007/0133174 A1* | 6/2007 | Mikami et al. | 361/700 |
| 2007/0279868 A1* | 12/2007 | Tanaka | 361/702 |
| 2008/0112201 A1 | 5/2008 | Yahata et al. | |
| 2008/0166246 A1* | 7/2008 | Swanson et al. | 417/410.1 |

FOREIGN PATENT DOCUMENTS

| | | | |
|---|---|---|---|
| JP | 11-298184 A | | 10/1999 |
| JP | 2001-332679 A | | 11/2001 |
| JP | 2004-316943 | * | 11/2004 |
| JP | 2004316943 A | * | 11/2004 |
| JP | 2006-013060 | * | 1/2006 |
| JP | 2006-013060 A | * | 1/2006 |
| JP | 2006-13060 A | | 1/2006 |
| JP | 2006013060 A | * | 1/2006 |
| JP | 2006-332475 | * | 12/2006 |
| JP | 2006-332475 A | | 12/2006 |
| JP | 2006-332475 A | * | 12/2006 |
| JP | 2006332475 A | * | 12/2006 |
| JP | 2007-150192 A | | 6/2007 |
| JP | 2008-125240 A | | 5/2008 |

\* cited by examiner

COOLING STRUCTURE WITH CONVENTIONAL HEAT SINK

HEAT SINK IS NOT GROUNDED

REFRIGERATION APPARATUS WITH A MAGNETICALLY SHIELDED REFRIGERANT PIPE

TECHNICAL FIELD

The present invention relates to a refrigeration apparatus which performs a vapor compression refrigeration cycle by circulating a refrigerant.

BACKGROUND ART

A refrigeration apparatus which performs a vapor compression refrigeration cycle by circulating a refrigerant includes an electrical circuit, such as an inverter circuit, to control an operation state of a motor of a compressor. In general, a power device which generates high heat is used as the inverter circuit. In conventional refrigeration apparatuses, a cooler for cooling the power device is provided to prevent the power device from generating heat higher than an operable temperature of the power device. As a specific example of the cooler, a heat sink may be attached to the power device to air-cool the power device, or a refrigerant used for the refrigeration cycle may be used to cool the power device (see, e.g., Patent Document 1). In a refrigeration apparatus of Patent Document 1, a refrigerant path through which the refrigerant used for the refrigeration cycle flows is provided in a refrigerant jacket (a heat sink in this patent document), the power device (a giant transistor in this patent document) is fixed to the refrigerant jacket, and the refrigerant jacket is placed in an electrical component box.

CITATION LIST

Patent Document

[Patent Document 1] Japanese Patent Publication No. S62-69066

SUMMARY OF THE INVENTION

Technical Problem

Some of the power devices include, as shown in FIG. 10, an insulated gate bipolar transistor (IGBT) bear chip (401), a heat spreader (402), an internal electrode (403), an insulator (404), and a metal plate (405) which are contained in a single package (406) of a resin mold. In a power device (400) of such a structure, a capacitor is formed between the internal electrode (403) and the metal plate (405) inside the power device (400). When a cooler (407), such as a heat sink or a refrigerant jacket made of a conductive body, is attached to the power device (400), a capacitor is formed between the metal plate (405) in the power device (400) and the cooler (407). These capacitors are connected in series (see FIG. 11).

In cooling the power device (400), when a heat sink is used as the cooler (407) to air-cool the power device (400), for example, the structure shown in FIG. 12 can be considered. In an example of FIG. 12, a power device (400), a common mode coil (409), a Y-capacitor (410), and a capacitor (411) are arranged on a printed circuit board (408) to constitute an electrical circuit. The Y-capacitor (410) is a capacitor provided between an AC power source line and a ground lead, and constitutes a noise filter together with the common mode coil (409). The capacitor (411) is used to smooth a voltage etc. In this configuration, the air-cooling heat sink is not grounded.

When a refrigerant jacket is used as the cooler (407) to cool the power device (400) with the refrigerant, the structure shown in FIG. 13 can be considered. In this example, the refrigerant jacket is connected to a refrigerant pipe (412). Therefore, the refrigerant jacket is grounded via a casing (413) containing the refrigerant jacket and a printed circuit board (408).

When the power device (400) performs switching, a high frequency current (high frequency noise) flows through a capacitor formed between the internal electrode (403) and the cooler (407) due to variations in potential of the internal electrode (403) relative to ground potential. The high frequency current flows outside the apparatus through the casing (413) and the ground lead as indicated by arrows in FIG. 14. Specifically, a noise transfer path in the refrigeration apparatus can be expressed by an equivalent circuit shown in FIG. 15. FIG. 15 also indicates the path of the high frequency current by arrows. In FIGS. 14 and 15, LISN indicates an apparatus for measuring the noise.

When the high frequency current which flowed outside the apparatus exceeds a predetermined level, noise problems, such as disturbance voltage, leakage current, etc., may arise. The magnitude of the high frequency current flowing outside the apparatus is determined by capacitance and the rate of change of voltage of the capacitor formed between the internal electrode (403) and the cooler (407). Specifically, the magnitude of the high frequency current (i) can be represented by $i=C \times dv/dt$ where C is the capacitance, and v is the voltage. In that respect, the air-cooling heat sink is not grounded in general. Therefore, the capacitance is not very large, and the high frequency current flowing outside the apparatus (common mode noise) is insignificant.

However, when the refrigerant jacket is used as the cooler (407), the refrigerant jacket is grounded because the refrigerant pipe which is made of a conductive material such as copper is connected to the refrigerant jacket, and the refrigerant pipe is connected to the casing. As a result, the capacitance may increase, thereby increasing the noise. Specifically, the noise which is insignificant when the power device (400) is air-cooled by the heat sink may become significant when the refrigerant jacket is used, depending on the level of the generated noise.

The present invention has been achieved in view of the above-described disadvantages. In cooling the power device using the refrigerant jacket in which the refrigerant used for the refrigeration cycle flows, the invention is intended to reduce the high frequency current which leaks from the refrigerant jacket, and becomes common mode noise.

Solution to the Problem

In order to solve the disadvantages described above, a first aspect of the invention is directed to a refrigeration apparatus including: an electrical circuit (10) including a power device (14); a refrigerant jacket (30) which is thermally connected to the power device (14), and in which a refrigerant for a refrigeration cycle flows, the refrigerant flowing in the refrigerant jacket (30) cooling the power device (14); a refrigerant pipe (20) which carries the refrigerant flowing in the refrigerant jacket (30), and forms a current path (20a, 20b) for grounding the refrigerant jacket (30); and a magnetic body (90) which is attached to the current path (20a, 20b), and generates a predetermined impedance in the current path (20a, 20b).

With this configuration, the impedance of the refrigerant pipe (20) becomes higher as compared with a general refrigerant pipe.

In a second aspect of the invention related to the first aspect of the invention, the refrigerant jacket (30) is grounded via multiple ones of the current path (20a, 20b), and the magnetic body (90) is attached to each of the current paths (20a, 20b).

With this configuration, even when the refrigerant pipe (20) functions as a plurality of current paths (20a, 20b), the impedance of each current path (refrigerant pipe) becomes higher as compared with a general refrigerant pipe.

In a third aspect of the invention related to the second aspect of the invention, the same number of the magnetic bodies (90) is attached to each of the current paths (20a, 20b).

With this configuration, when the refrigerant pipe (20) functions as a plurality of current paths, the impedances of the current paths (20a, 20b) can be made uniform.

In a fourth aspect of the invention related to the first aspect of the invention, the refrigerant jacket (30) is grounded via multiple ones of the current path (20a, 20b), and the single magnetic body (90) generates a predetermined impedance in the multiple ones of the current path (20a, 20b).

With this configuration, when the refrigerant pipe (20) functions as a plurality of current paths (20a, 20b), the impedances of the current paths (20a, 20b) can be made uniform. Further, the number of the magnetic body (90) can be reduced.

In a fifth aspect of the invention related to the first aspect of the invention, multiple ones of the magnetic body (90) are attached to the single current path (20a, 20b).

With this configuration, the impedance and the frequency properties of the current path (20a, 20b) can be adjusted.

In a sixth aspect of the invention related to the first aspect of the invention, the magnetic body (90) is in the shape of a hollow column, and the magnetic body (90) is attached to the current path (20a, 20b) in such a manner that the current path (20a, 20b) goes through a hollow part of the magnetic body (90) only one time.

With this configuration, the magnetic body (90) can easily be attached to the refrigerant pipe (20).

In a seventh aspect of the invention related to the first aspect of the invention, the magnetic body (90) is annular, and the current path (20a, 20b) is wound around the magnetic body (90) in such a manner that the current path (20a, 20b) goes through a hollow part of the annular magnetic body (90) two or more times.

With this configuration, the impedance and the frequency properties of the current path (20a, 20b) can be adjusted.

In an eighth aspect of the invention related to the first aspect of the invention, the magnetic body (90) is made of a ferrite core.

With this configuration, the ferrite core generates a predetermined impedance in the refrigerant pipe (20) as the current path.

Advantages of the Invention

According to the first aspect of the invention, the high frequency current which leaks from the refrigerant jacket (30), and becomes the common mode noise can be reduced.

According to the second aspect of the invention, high frequency current which leaks from the refrigerant jacket (30), and becomes the common mode noise can reliably be reduced.

According to the third aspect of the invention, the impedances of the current paths (20a, 20b) are made uniform. Therefore, the magnitudes of the high frequency currents flowing in the current paths (20a, 20b), respectively, can be made uniform, thereby effectively using the properties of the magnetic body (90). This allows reliable reduction of the high frequency current which becomes the common mode noise.

According to the fourth aspect of the invention, the impedances of the current paths (20a, 20b) can be made uniform. Therefore, the magnitudes of the high frequency currents flowing in the current paths (20a, 20b), respectively, can be made uniform, thereby effectively using the properties of the magnetic body (90). This allows reliable reduction of the high frequency current which becomes the common mode noise. Further, the number of the magnetic body (90) can be reduced, thereby making the manufacture of the refrigeration apparatus (1) easy.

According to the fifth aspect of the invention, the impedance and the frequency properties of the current path (20a, 20b) can be adjusted. This allows easy reduction of the common mode noise.

According to the sixth aspect of the invention, the magnetic body (90) can easily be attached to the refrigerant pipe (20). This makes the manufacture of the refrigeration apparatus (1) easy.

According to the seventh aspect of the invention, the impedance and the frequency properties of the current path (20a, 20b) can be adjusted. This allows easy reduction of the common mode noise.

According to the eighth aspect of the invention, the magnetic body (90) can easily be formed.

DESCRIPTION OF EMBODIMENTS

Figure 1:
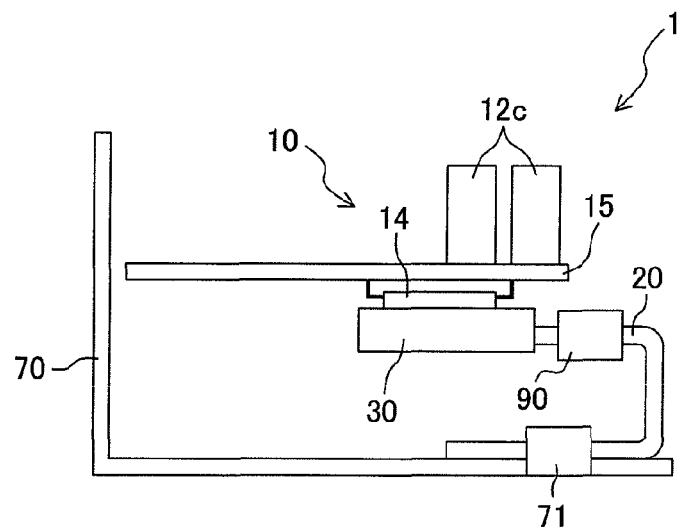
FIG. 1 shows part of a refrigeration apparatus (1) of a first embodiment of the present invention.

Embodiments of the present invention will be described below with reference to the drawings. The following embodiments are set forth merely for the purposes of preferred examples in nature, and are not intended to limit the scope, applications, and use of the invention. In the following embodiments and alternative examples, components having the similar function as those once described will be indicated by the same reference characters for easy description.

First Embodiment

FIG. 1 shows part of a refrigeration apparatus (1) of an embodiment of the present invention. The refrigeration apparatus (1) may be applied to, for example, an air conditioner which performs cooling and heating by a vapor compression refrigeration cycle. FIG. 1 shows an electrical circuit (10) which controls the number of rotation of a motor (M) of a compressor (not shown) which compresses a refrigerant used for the refrigeration cycle, and its vicinity. As shown in FIG. 1, a refrigerant pipe (20), a refrigerant jacket (30), and a magnetic body (90) are arranged in the vicinity of the electrical circuit (10), and are contained in a box-shaped casing (70) made of metal (a conductive material) such as iron.

The refrigerant pipe (20) is a pipe in which the refrigerant for the refrigeration cycle flows, and is made of a copper pipe, for example. The refrigerant pipe (20) is fixed to the casing (70) by a metal bracket (71), and is grounded via a ground lead etc. attached to the casing (70).

Figure 2:
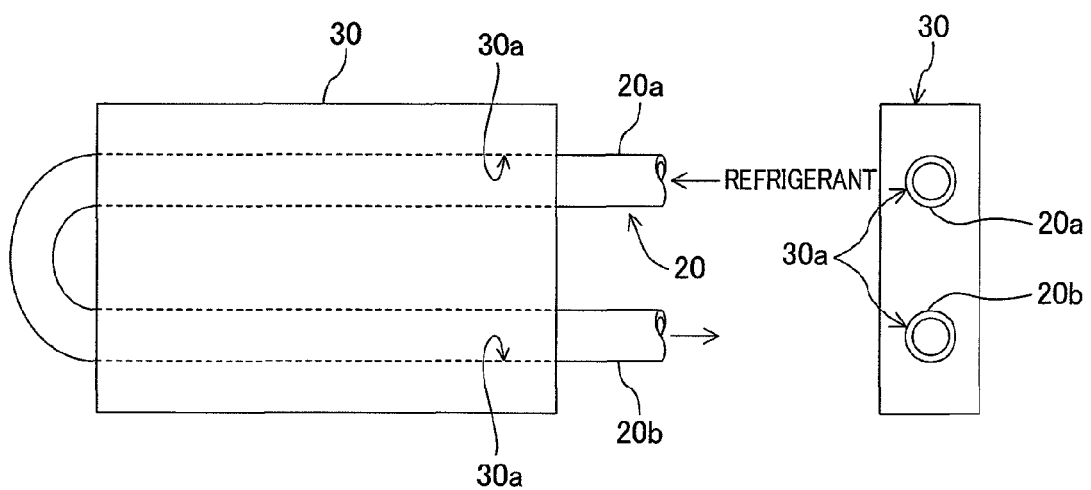
FIG. 2 shows how a refrigerant pipe (20) is attached to a refrigerant jacket (30).

The refrigerant jacket (30) is made of metal such as aluminum, is shaped into a flat rectangular parallelepiped, and is thermally connected to the refrigerant pipe (20) while covering part of the refrigerant pipe (20). Specifically, as shown in FIG. 2, the refrigerant jacket (30) includes two through holes (30a) in which the refrigerant pipe (20) is fitted. The refrigerant pipe (20) passes through one of the through holes (30a), is curved in the shape of U, and then passes through the other through hole (30a). That is, the refrigerant for the refrigeration cycle flows inside the refrigerant jacket (30) through the refrigerant pipe (20).

The refrigerant jacket (30) and the refrigerant pipe (20) are electrically connected. Since the refrigerant pipe (20) is grounded via the casing (70) etc., as described above, the refrigerant jacket (30) is also grounded. In this case, the refrigerant jacket (30) covers the single refrigerant pipe (20) as described above. This can be considered as a single refrigerant path. However, the refrigerant jacket (30) is grounded via part of the refrigerant pipe (20) through which the refrigerant flows into the refrigerant jacket (30), and the refrigerant jacket (30) is grounded via part of the refrigerant pipe (20) through which the refrigerant flows out of the refrigerant jacket (30). Specifically, the part of the refrigerant pipe (20) through which the refrigerant flows into the refrigerant jacket (30), and the part of the refrigerant pipe (20) through which the refrigerant flows out of the refrigerant jacket (30) function as different current paths (20a, 20b).

Figure 3:
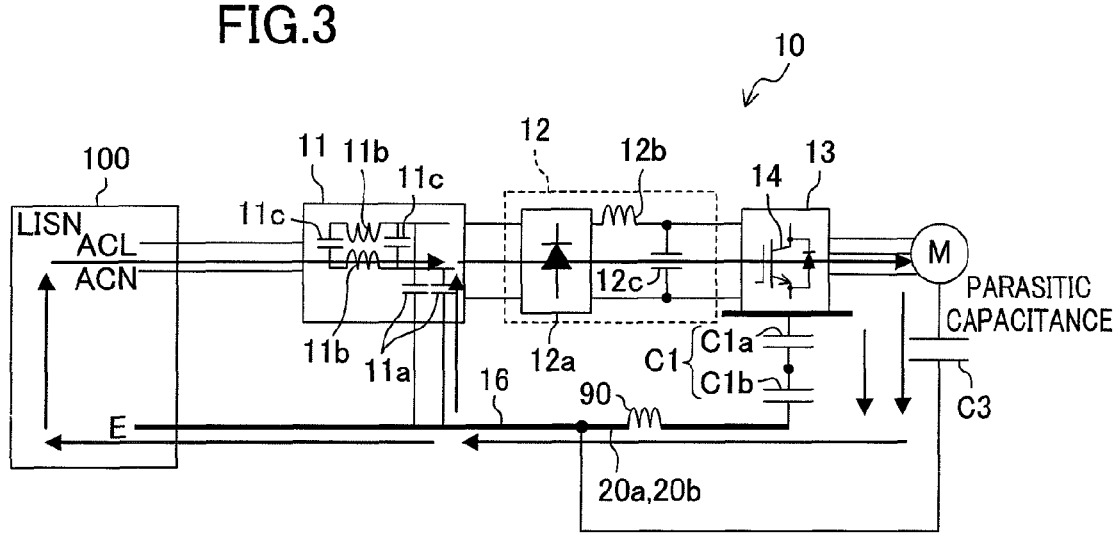
FIG. 3 is a block diagram illustrating a major part of an electrical circuit (10).

FIG. 3 is a block diagram illustrating a major part of the electrical circuit (10). In an example shown in FIG. 3, the electrical circuit (10) includes a noise filter (11), a DC link (12), and an inverter circuit (13) which are arranged on a printed circuit board (15). A LISN (100) shown in FIG. 3 is a device for measuring the noise, and is not a component of the electrical circuit (10). The LISN (100) has 50 Ω as a resistance, and measures the noise as a voltage.

The noise filter (11) is connected to a commercial power supply (e.g., AC 100V), and reduces the noise at an input side of an alternating current. As shown in FIG. 3, the noise filter (11) includes Y-capacitors (11a) which are provided between AC power supply lines and ground leads, common mode coils (11b), and X-capacitors (11c) connecting the AC power supply lines. The noise filter (11) may further include a normal mode coil.

The DC link (12) includes a rectifier (12a), a reactor (12b), and a smoothing capacitor (12c), and rectifies the alternating current input through the noise filter (11) to output DC power.

Figure 4:
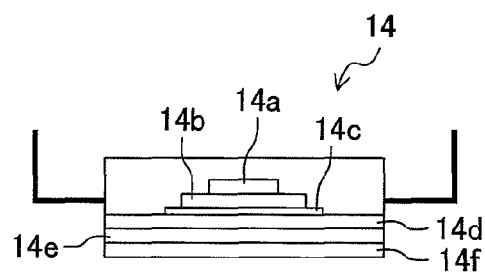
FIG. 4 shows an example of the structure of a power device (14).
Figure 5:
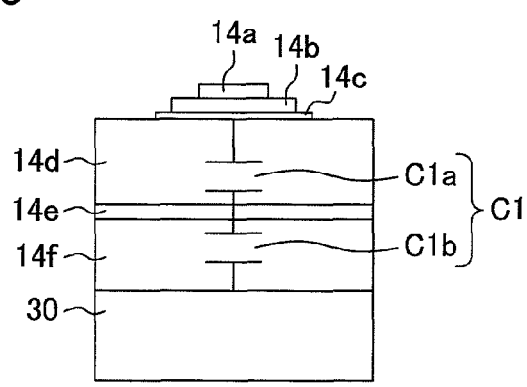
FIG. 5 shows a parasitic capacitance generated in the power device (14).

The inverter circuit (13) receives the DC power from the DC link (12) to supply AC power of a predetermined voltage to the motor (M). The inverter circuit (13) includes a power device (14) as a switching element. The power device (14) of the present embodiment includes, as shown in FIG. 4, an IGBT bear chip (14a), a heat spreader (14b), an internal electrode (14c), an insulator (14d), and a metal plate (14e) which are contained in a single package (14f) of a resin mold. In this configuration, as shown in FIG. 5, the internal electrode (14c), the insulator (14d), and the metal plate (14e) form a capacitor (C1a) in the power device (14).

The power device (14) generates heat when the motor (M) is operated, and the temperature of the power device (14) may exceed an operable temperature (e.g., 90° C.) of the power device (14) if the power device (14) is not cooled. Therefore, in the refrigeration apparatus (1), as shown in FIG. 1, the refrigerant jacket (30) is fixed to the power device (14) to cool the power device (14) with the refrigerant flowing through the refrigerant jacket (30). Specifically, in this configuration, the heat of the power device (14) is transferred to the refrigerant jacket (30), and is dissipated to the refrigerant flowing through the refrigerant jacket (30).

In this configuration, the metal plate (14e), the package (14f), and the refrigerant jacket (30) form a capacitor (C1b). The capacitor (C1b) is connected to the capacitor (C1a) in series (see FIG. 5). The series-connected capacitors (C1a, C1b) will be referred to as a capacitor (C1). For example, when the power device (14) performs switching, a high frequency current flows through the capacitor (C1), and is propagated to the refrigerant jacket (30) due to variations in potential of the internal electrode (14c) relative to ground potential. The high frequency current propagated to the refrigerant jacket (30) flows into the refrigerant pipe (20) as the current paths (20a, 20b) because the refrigerant jacket (30) is electrically connected to the refrigerant pipe (20).

Figure 6:
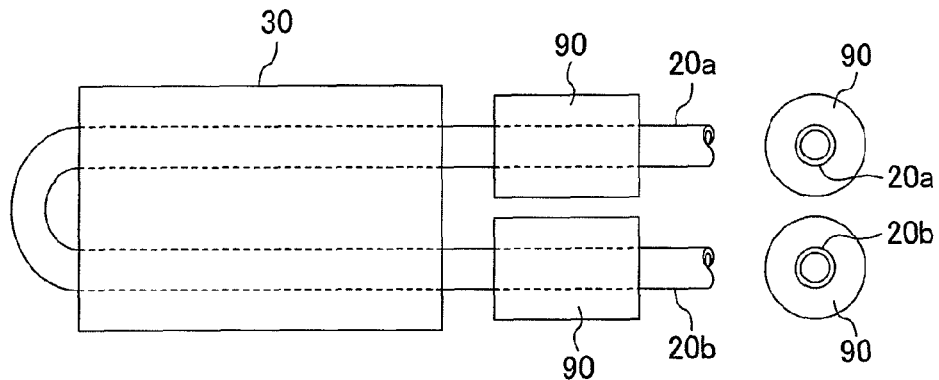
FIG. 6 shows the structure of a magnetic body (90), and shows how the magnetic body is attached to the refrigerant pipe (20).

The magnetic body (90) is provided to generate a predetermined impedance in each of the current paths (20a, 20b). This reduces the high frequency current which flows from the refrigerant jacket (30) to the refrigerant pipe (20) as described above. In the present embodiment, a ferrite core in the shape of a hollow column (in particular, a cylindrical hollow column) is used as the magnetic body (90) as shown in FIG. 6, and the refrigerant pipe (20) is inserted in a hollow hole of the magnetic body (90). Specifically, the magnetic body (90) has a hollow hole having a diameter approximately the same as an outer diameter of the refrigerant pipe (20), and only a single refrigerant pipe (20) can be inserted in the hollow hole.

In the refrigeration apparatus (1), the two current paths (20a, 20b) are connected to the refrigerant jacket (30). Therefore, the magnetic body (90) is attached to each of the current paths (20a, 20b). In this case, the magnetic bodies (90) attached to the current paths (20a, 20b) may have different properties. However, with use of the magnetic bodies (90) having the same properties, the magnitudes of the high frequency currents flowing into the current paths (20a, 20b) can be made uniform. As a result, the properties of the magnetic bodies (90) can effectively be used, thereby effectively reducing the common mode noise. Use of the magnetic bodies of the same properties is preferable because they can easily be manufactured. The magnetic body (90) may be attached to any part of the current path (20a, 20b) without any limitation, but the magnetic body (90) is preferably attached to a source of the high frequency current to be reduced, i.e., near the refrigerant jacket (30) as shown in FIG. 6.

—Propagation of Common Mode Noise in Refrigeration Apparatus (1)—

When the power device (14) performs switching in the above-described refrigeration apparatus (1), the high frequency current flows into the capacitor (C1) due to variations in potential of the internal electrode (14*c*) relative to ground potential. The high frequency current is propagated to the motor (M) and the refrigerant jacket (30). Depending on the structure of the refrigeration apparatus (1), a capacitor (C3) (parasitic capacitance) is formed between the motor (M) and the casing (70), and the high frequency current propagated to the motor (M) flows out of the apparatus as common mode noise through the capacitor (C3).

The high frequency current propagated to the refrigerant jacket (30) flows into the refrigerant pipe (20) which function as the current paths (20*a*, 20*b*). The refrigerant pipe (20), to which the magnetic body (90) is attached, has a higher impedance as compared with a general refrigerant pipe (a refrigerant pipe without the magnetic body (90)). Therefore, the magnitude of the high frequency current flowing from the refrigerant jacket (30) to the refrigerant pipe (20) is reduced as compared with the case where the general refrigerant pipe is used.

Thus, according to the present embodiment, in cooling the power device using the refrigerant jacket in which the refrigerant for the refrigeration cycle flows, the high frequency current which leaks from the refrigerant jacket and becomes the common mode noise can be reduced.

First Alternative Example of First Embodiment

Figure 7:
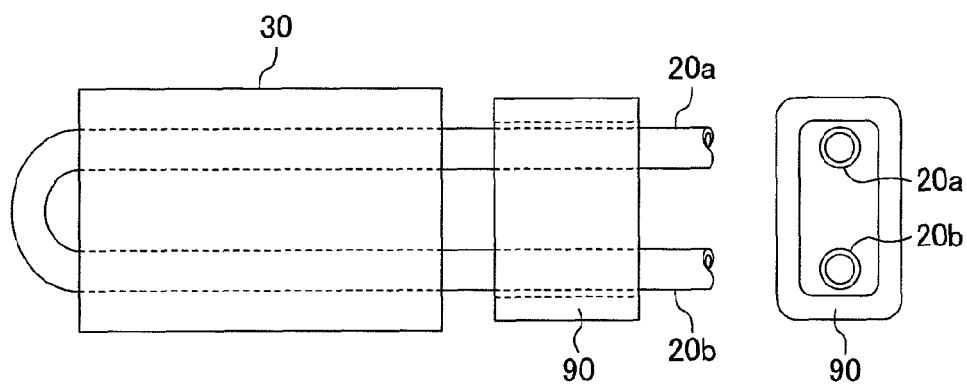
FIG. 7 shows the structure of a magnetic body (90) of a first alternative example of the first embodiment, and shows how the magnetic body is attached to the refrigerant pipe (20).

FIG. 7 shows the structure of a magnetic body (90) according to a first alternative example of the first embodiment. The magnetic body (90) of this alternative example is in the shape of a hollow column (in the shape of a hollow prism in this example), and is configured in such a manner that the single magnetic body (90) generates a predetermined impedance relative to a plurality of current paths (20*a*, 20*b*) (two current paths in this example). With the magnetic body (90) of this configuration, the impedances of the current paths (20*a*, 20*b*) can be made uniform. As a result, the magnitudes of the high frequency currents flowing into the current paths (20*a*, 20*b*) can be made uniform. Thus, according to this alternative example, the properties of the magnetic body (90) can effectively be used, thereby effectively reducing the common mode noise.

Further, the number of the magnetic body (90) can be reduced, thereby allowing easy manufacture of the refrigeration apparatus (1).

Second Alternative Example of First Embodiment

Figure 8:
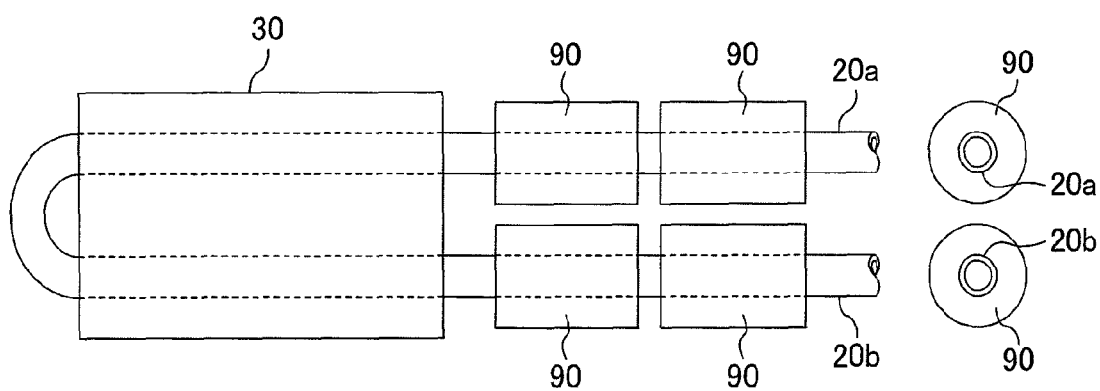
FIG. 8 shows how a magnetic body (90) of a second alternative example of the first embodiment is attached.

FIG. 8 shows how a magnetic body (90) of a second alternative example of the first embodiment is attached. In this example, a plurality of magnetic bodies (90) are provided relative to a single current path (20*a*, 20*b*). For example, this configuration is suitable for adjusting the magnitude of the impedance generated in each current path (20*a*, 20*b*) and frequency properties when a commercially available ferrite core is used as the magnetic body (90). Thus, this example allows easy reduction of the common mode noise.

In providing the plurality of magnetic bodies (90), if the same number of the magnetic bodies (90) is attached to each of the current paths (20*a*, 20*b*), the magnitudes of the high frequency currents flowing into the current paths (20*a*, 20*b*) can be made uniform. Thus, according to this alternative example, the properties of the magnetic body (90) can effectively used, thereby effectively reducing the common mode noise.

Second Embodiment

Figure 9:
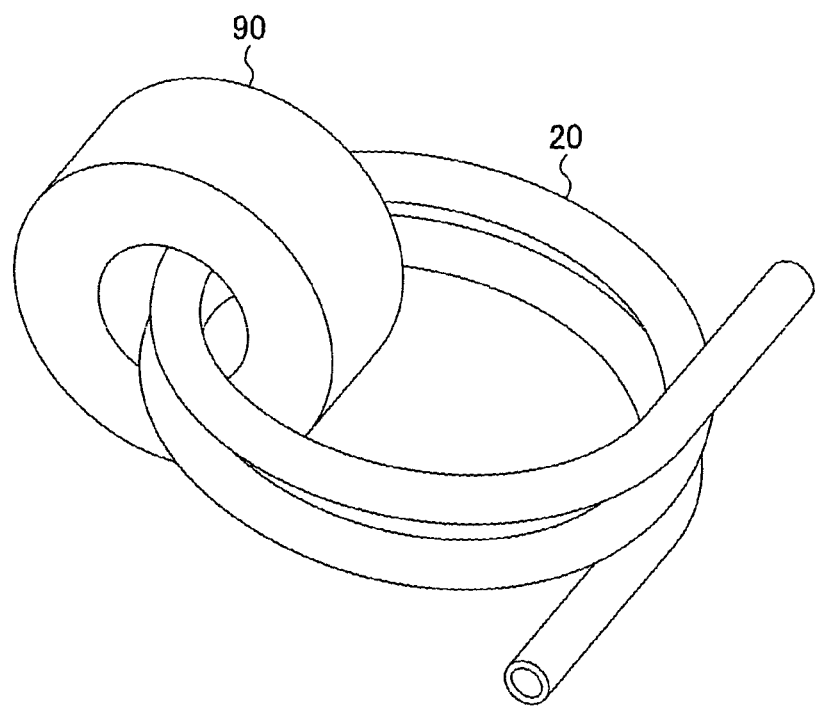
FIG. 9 shows how a magnetic body (90) of a second embodiment is attached.
Figure 10:
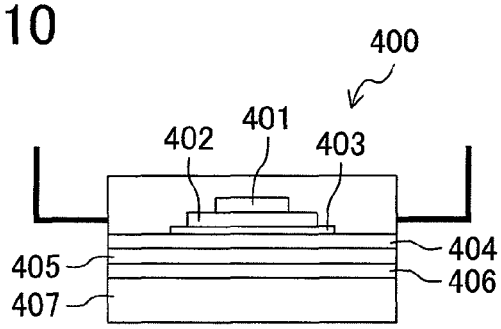
FIG. 10 shows an example of the structure of a power device.
Figure 11:
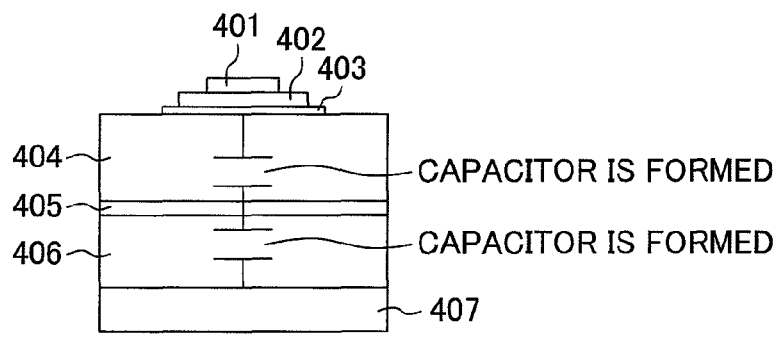
FIG. 11 shows a parasitic capacitance generated in the power device.
Figure 12:
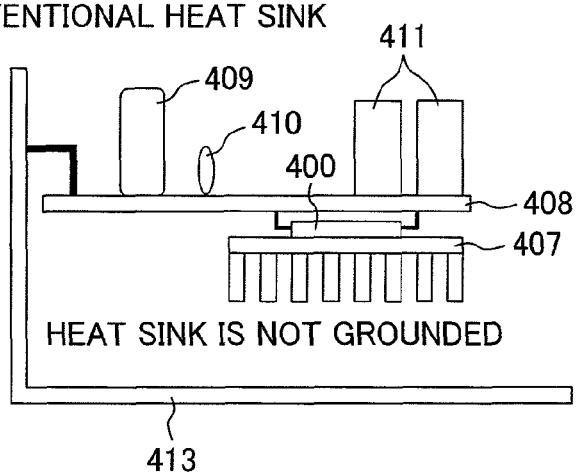
FIG. 12 shows an example of the structure in which a power device is air-cooled by a heat sink.
Figure 13:
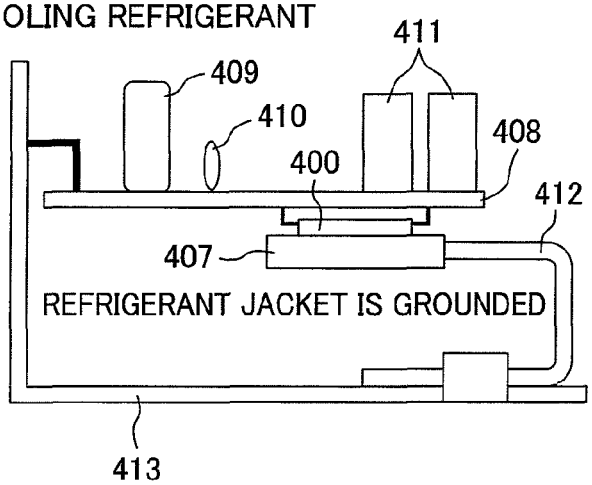
FIG. 13 shows an example of the structure in which a power device is cooled with a refrigerant flowing in a refrigerant jacket.
Figure 14:
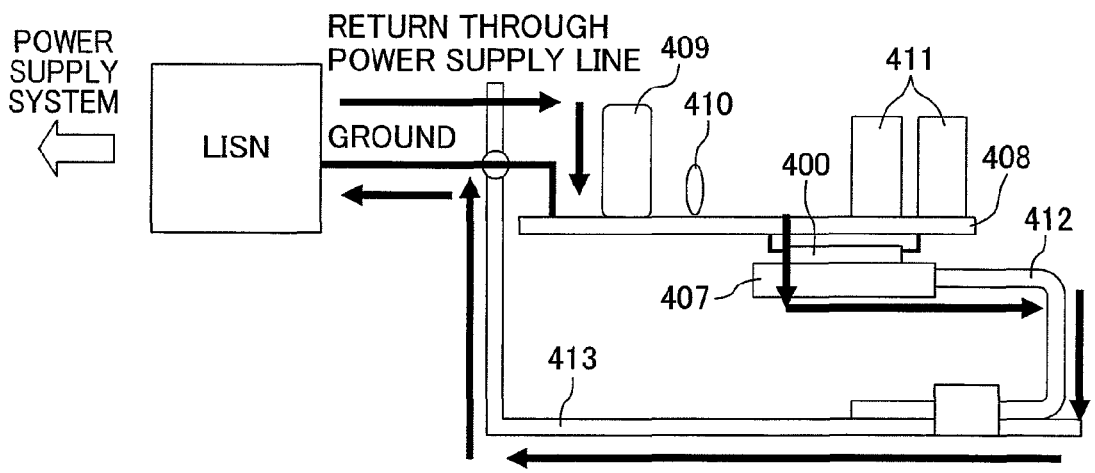
FIG. 14 shows a propagation path of common mode noise.
Figure 15:
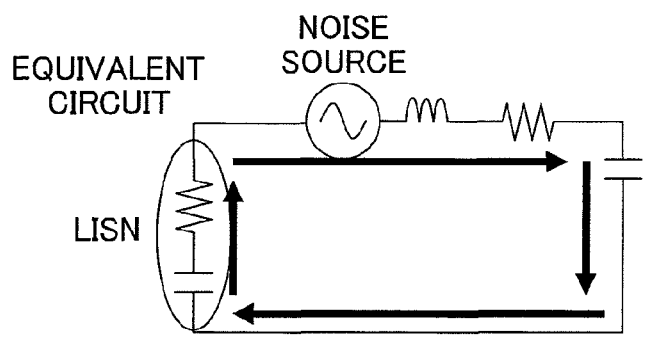
FIG. 15 shows a circuit equivalent to the propagation path of the common mode noise shown in FIG. 14.

FIG. 9 shows how a magnetic body (90) of a second embodiment of the present invention is attached, and shows only a single current path (a refrigerant pipe (20)). The magnetic body (90) of this embodiment is annular (ring-shaped). The refrigerant pipe (20) is wound around the annular magnetic body (90) in such a manner that the refrigerant pipe (20) goes through a hollow part of the annular magnetic body (90) two or more times.

With this configuration, the impedance can easily be adjusted, thereby reducing the common mode noise more effectively.

INDUSTRIAL APPLICABILITY

The refrigeration apparatus of the present invention is useful as a refrigeration apparatus which performs a vapor compression refrigeration cycle by circulating a refrigerant.

DESCRIPTION OF REFERENCE CHARACTERS

1 Refrigeration apparatus
10 Electrical circuit
14 Power device
20 Refrigerant pipe
20*a*, 20*b* Current path
30 Refrigerant jacket
90 Magnetic body

The invention claimed is:

1. A refrigeration apparatus that performs a vapor compression refrigeration cycle by compressing a refrigerant, the refrigeration apparatus comprising:
    a casing made of an electrically conductive material;
    an electrical circuit including a power device housed within the casing;
    a refrigerant jacket which is thermally connected to the power device, and in which the refrigerant for the vapor compression refrigeration cycle flows, the refrigerant flowing in the refrigerant jacket cooling the power device;
    a refrigerant pipe connected to the refrigerant jacket and carrying the refrigerant flowing in the refrigerant jacket from a compressor that compresses the refrigerant, and forming one or more electric current paths for grounding the refrigerant jacket, the refrigerant pipe attached to the casing by a bracket at an attachment point and grounded via a ground lead attached to the casing;
    a motor driven by the power device and powering the compressor to compress the refrigerant during the vapor compression refrigeration cycle; and
    a magnetic body provided at a location along the one or more electric current paths, the location being
        between the refrigerant jacket and the attachment point of the refrigerant pipe attached to the casing of the refrigeration apparatus and
        closer to the refrigerant jacket than the attachment point, wherein
    the magnetic body generates a predetermined impedance in the one or more electric current paths and reduces noise leaking from the refrigerant jacket.

2. The refrigeration apparatus of claim 1, wherein
the refrigerant jacket is grounded via multiple electric current paths, and
the magnetic body is attached to each of the multiple electric current paths.

3. The refrigeration apparatus of claim 2, wherein
the same number of the magnetic bodies is attached to each of the multiple electric current paths.

4. The refrigeration apparatus of claim 1, wherein
the refrigerant jacket is grounded via multiple electric current paths, and
the single magnetic body generates a predetermined impedance in the multiple electric current paths.

5. The refrigeration apparatus of claim 1, wherein
multiple magnetic bodies are attached to at least one of the one or more electric current paths.

6. The refrigeration apparatus of claim 1, wherein
the magnetic body is in the shape of a hollow column, and
the magnetic body is attached to the one or more electric current paths in such a manner that the one or more electric current paths goes through a hollow part of the magnetic body only one time.

7. The refrigeration apparatus of claim 1, wherein
the magnetic body is annular, and
the one or more electric current paths is wound around the magnetic body in such a manner that the one or more electric current paths goes through a hollow part of the annular magnetic body two or more times.

8. The refrigeration apparatus of claim 1, wherein the magnetic body is made of a ferrite core.

* * * * *